(12) United States Patent
Fang

(10) Patent No.: US 12,363,829 B2
(45) Date of Patent: Jul. 15, 2025

(54) MOUNTING ASSEMBLY AND CIRCUIT BOARD ASSEMBLY

(71) Applicant: ADLINK TECHNOLOGY INC., Taoyuan (TW)

(72) Inventor: Chih-Liang Fang, Taoyuan (TW)

(73) Assignee: ADLINK TECHNOLOGY INC., Taoyuan (TW)

( * ) Notice: Subject to any disclaimer, the term of this patent is extended or adjusted under 35 U.S.C. 154(b) by 220 days.

(21) Appl. No.: 18/239,001

(22) Filed: Aug. 28, 2023

(65) Prior Publication Data

US 2025/0031309 A1    Jan. 23, 2025

(30) Foreign Application Priority Data

Jul. 19, 2023    (TW) ................................. 112207530

(51) Int. Cl.
*H05K 1/18* (2006.01)
(52) U.S. Cl.
CPC ..... *H05K 1/18* (2013.01); *H05K 2201/10462* (2013.01)
(58) Field of Classification Search
CPC ...................... H05K 1/18; H05K 2201/10462
See application file for complete search history.

(56) References Cited

U.S. PATENT DOCUMENTS

| 2023/0135341 A1* | 5/2023 | Tang | H01R 33/97 439/62 |
| 2023/0269897 A1* | 8/2023 | Zhang | G06F 1/185 174/261 |
| 2024/0297459 A1* | 9/2024 | Li | H05K 1/18 |

FOREIGN PATENT DOCUMENTS

| CN | 119364649 A | * | 1/2025 |
| DE | 202021105085 U1 | * | 2/2022 |

* cited by examiner

*Primary Examiner* — Nathan Milakovich
(74) *Attorney, Agent, or Firm* — Maschoff Brennan

(57) ABSTRACT

A mounting assembly and a circuit board assembly. The mounting assembly configured to mount a short or long expansion card on the circuit board. The mounting assembly includes a fixed plate and a rotatable plate. The rotatable plate includes a body part, a pivot part and a fastening part. The pivot part is rotatably disposed on the fixed plate. The fastening part has a fastening hole. A pivot axis of the pivot part is spaced apart from a central axis of the fastening hole. When the fastening hole is at the first mounting position, the fastening hole is located closer to the connector than the pivot part to fix the short expansion card. When the fastening hole is at the second mounting position, the fastening hole is located farther away from the connector than the pivot part to fix the long expansion card.

10 Claims, 11 Drawing Sheets

MOUNTING ASSEMBLY AND CIRCUIT BOARD ASSEMBLY

CROSS-REFERENCE TO RELATED APPLICATIONS

This non-provisional application claims priority under 35 U.S.C. § 119(a) on Patent Application No(s). 112207530 filed in Taiwan, R.O.C. on Jul. 19, 2023, the entire contents of which are hereby incorporated by reference.

TECHNICAL FIELD

The disclosure relates to a mounting assembly and a circuit board assembly, more particularly to a mounting assembly configured to mount an expansion card and a circuit board assembly including the same.

BACKGROUND

In general, since signals in different bands are applied in different countries, M.2 solid-state drives (SSD) having various sizes are required to be disposed in a communication assembly applying 4G or 5G technology. Recently, such communication assembly is further required to include M.2 SSDs having similar sizes.

M.2 SSD is usually mounted onto the circuit board via a holder configured for a screw to be screwed therein. However, when two M.2 SSDs have similar sizes, the holders for mounting the two M.2 SSDs are too close to be disposed on the circuit board due to an interference issue. To solve this issue, traditionally, some manufactures design an elongated hole (e.g., oval hole) on the circuit board. In this way, the M.2 SSDs having similar sizes is allowed to be mounted onto the circuit board by adjusting the position of the screw in the elongated hole.

However, screw threads are unable to be disposed in the elongated hole. Thus, to hold the M.2 SSD in position, the screw is required to be screwed in the holder from a bottom surface of the circuit board, which makes the mounting for the M.2 SSD inconvenient.

SUMMARY

The disclosure provides a mounting assembly and a circuit board assembly, where the mounting assembly is able to be shared among a short expansion card and a long expansion card having similar sizes while allowing easy mounting for the short expansion card or the long expansion card.

One embodiment of this disclosure provides a mounting assembly configured to mount a short expansion card or a long expansion card on the circuit board. The short expansion card or the long expansion card is configured to be plugged in a connector on the circuit board. The mounting assembly includes a fixed plate and a rotatable plate. The fixed plate is configured to be fixed on the circuit board. The rotatable plate includes a body part, a pivot part and a fastening part. The pivot part and the fastening part protrude from two opposite sides of the body part, respectively. The pivot part is rotatably disposed on the fixed plate. The fastening part has a fastening hole. The fastening hole is configured to allow a fastener to be fixed therein. A pivot axis of the pivot part is spaced apart from a central axis of the fastening hole so that the fastening hole has a first mounting position and a second mounting position. When the fastening hole is at the first mounting position, the fastening hole is located closer to the connector than the pivot part to be configured to fix the short expansion card. When the fastening hole is at the second mounting position, the fastening hole is located farther away from the connector than the pivot part to be configured to fix the long expansion card.

Another embodiment of this disclosure provides a circuit board assembly configured for a short expansion card or a long expansion card to be mounted thereon. The circuit board assembly includes a circuit board, a connector, a mounting assembly and a fastener. The connector is disposed on the circuit board and configured for the short expansion card or the long expansion card to be plugged therein. The mounting assembly includes a fixed plate and a rotatable plate. The fixed plate is fixed on the circuit board and located on a side of the connector. The rotatable plate includes a body part, a pivot part and a fastening part. The pivot part and the fastening part protrude from two opposite sides of the body part, respectively. The pivot part is rotatably disposed on the fixed plate. The fastening part has a fastening hole. The fastener is fixed in the fastening hole. A pivot axis of the pivot part is spaced apart from a central axis of the fastening hole so that the fastening hole has a first mounting position and a second mounting position. When the fastening hole is at the first mounting position, the fastening hole is located closer to the connector than the pivot part to be configured to fix the short expansion card. When the fastening hole is at the second mounting position, the fastening hole is located farther away from the connector than the pivot part to be configured to fix the long expansion card.

According to the mounting assembly and the circuit board assembly disclosed by above embodiments, the pivot axis of the pivot part is spaced apart from the central axis of the fastening hole. Thus, the fastening hole is allowed to be located closer to the connector than the pivot part at the first mounting position, thereby being configured to fix the short expansion card. Also, the fastening hole is allowed to be located farther away from the connector than the pivot part at the second mounting position, thereby being configured to fix the long expansion card. Additionally, the fastener can be fixed in the fastening hole from the top surface of the circuit board. Accordingly, the mounting assembly is able to be shared among the short expansion card and the long expansion card having similar sizes while allowing easy mounting for the short expansion card or the long expansion card.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
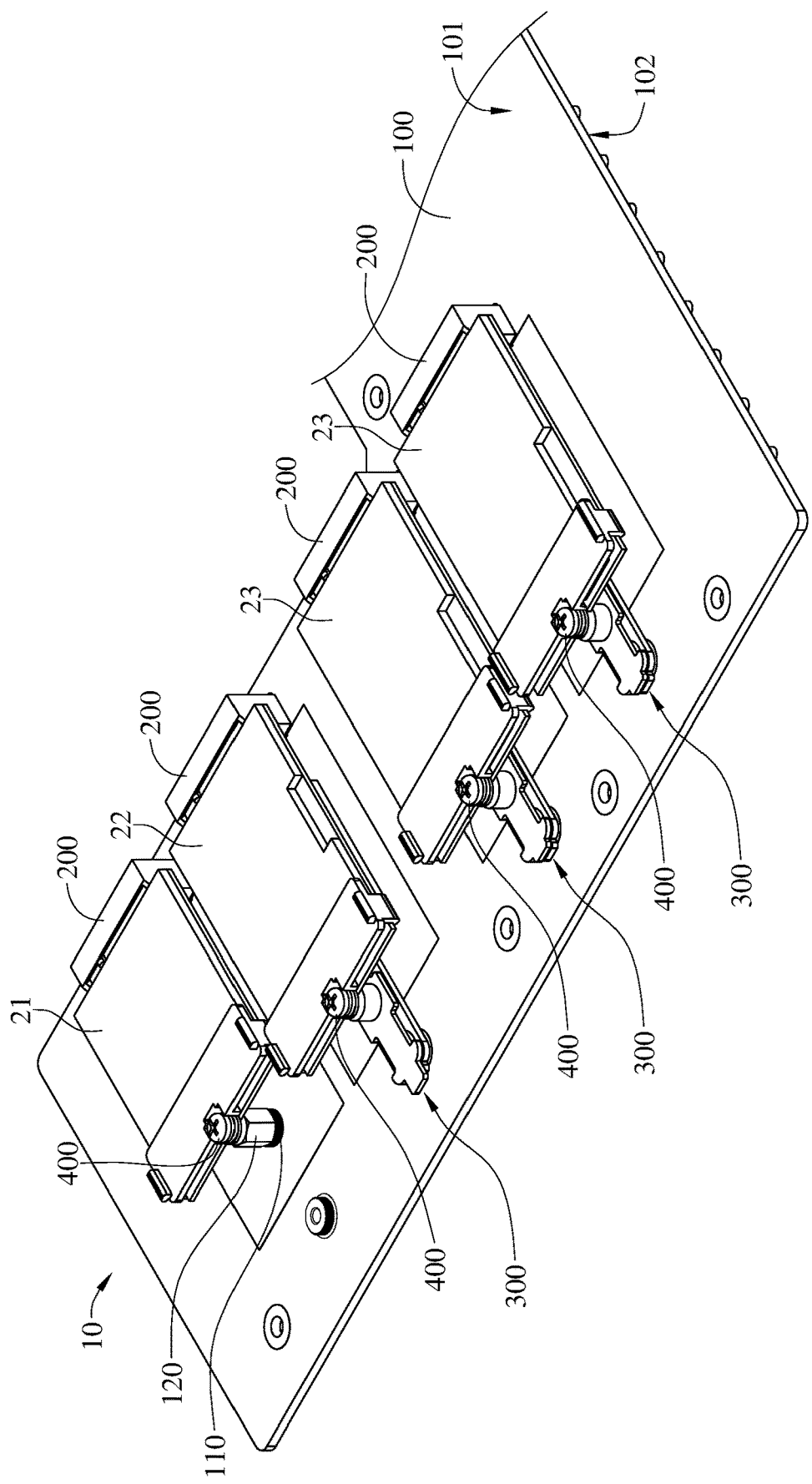
FIG. 1 is a partially enlarged perspective view of a circuit board assembly according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
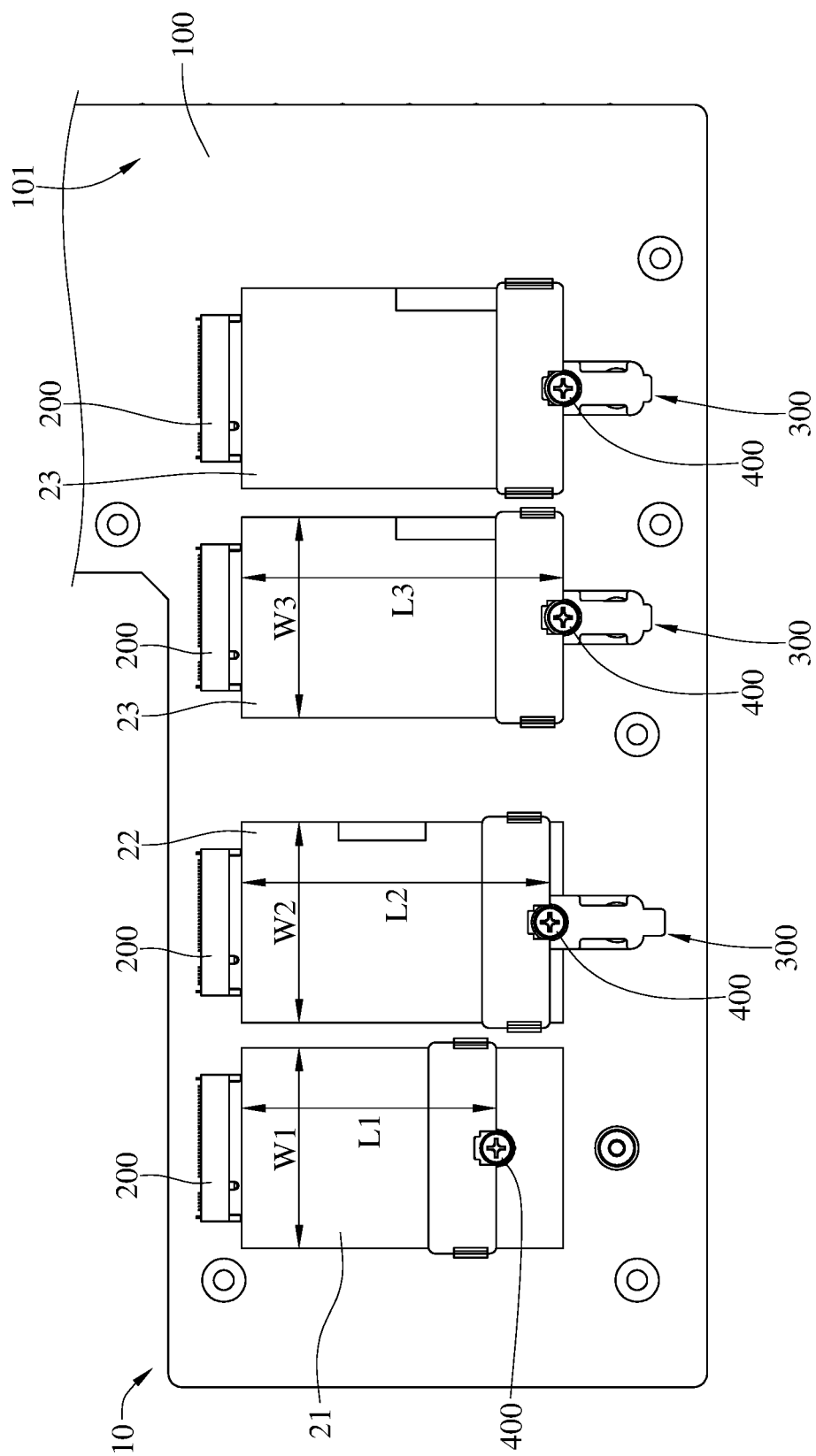
FIG. 2 is a partially enlarged top view of the circuit board assembly in FIG. 1.

Please refer to FIGS. 1 to 2. FIG. 1 is a partially enlarged perspective view of a circuit board assembly 10 according to a first embodiment of the disclosure. FIG. 2 is a partially enlarged top view of the circuit board assembly 10 in FIG. 1.

In this embodiment, the circuit board assembly 10 is configured for two short expansion cards 21 and 22 and two long expansion cards 23 to be mounted thereon. In this embodiment, the circuit board assembly 10 includes a circuit board 100, a plurality of connectors 200, a plurality of mounting assemblies 300 and a plurality of fasteners 400.

The connectors 200 are disposed on the circuit board 100, and are configured for the short expansion cards 21 and 22 and the long expansion cards 23 to be plugged therein. For example, the connectors 200 conform to M.2 specification, and the short expansion cards 21 and 22 and the long expansion cards 23 are solid-state drives (SSD) that conform to M.2 specification. Further, for example, a width W1 and a length L1 of the short expansion card 21 are 30 millimeters (mm) and 42 mm, respectively; a width W2 and a length L2 of the short expansion card 22 are 30 mm and 50 mm, respectively; a width W3 and a length L3 of each long expansion card 23 are 30 mm and 52 mm, respectively.

The mounting assemblies 300 are similar in structure, and are connected to the fasteners 400 in similar manners. Thus, only the detailed structure of one mounting assembly 300 and the connection relationship between that mounting assembly 300 and the corresponding fastener 400 will be described below.

Figure 3:
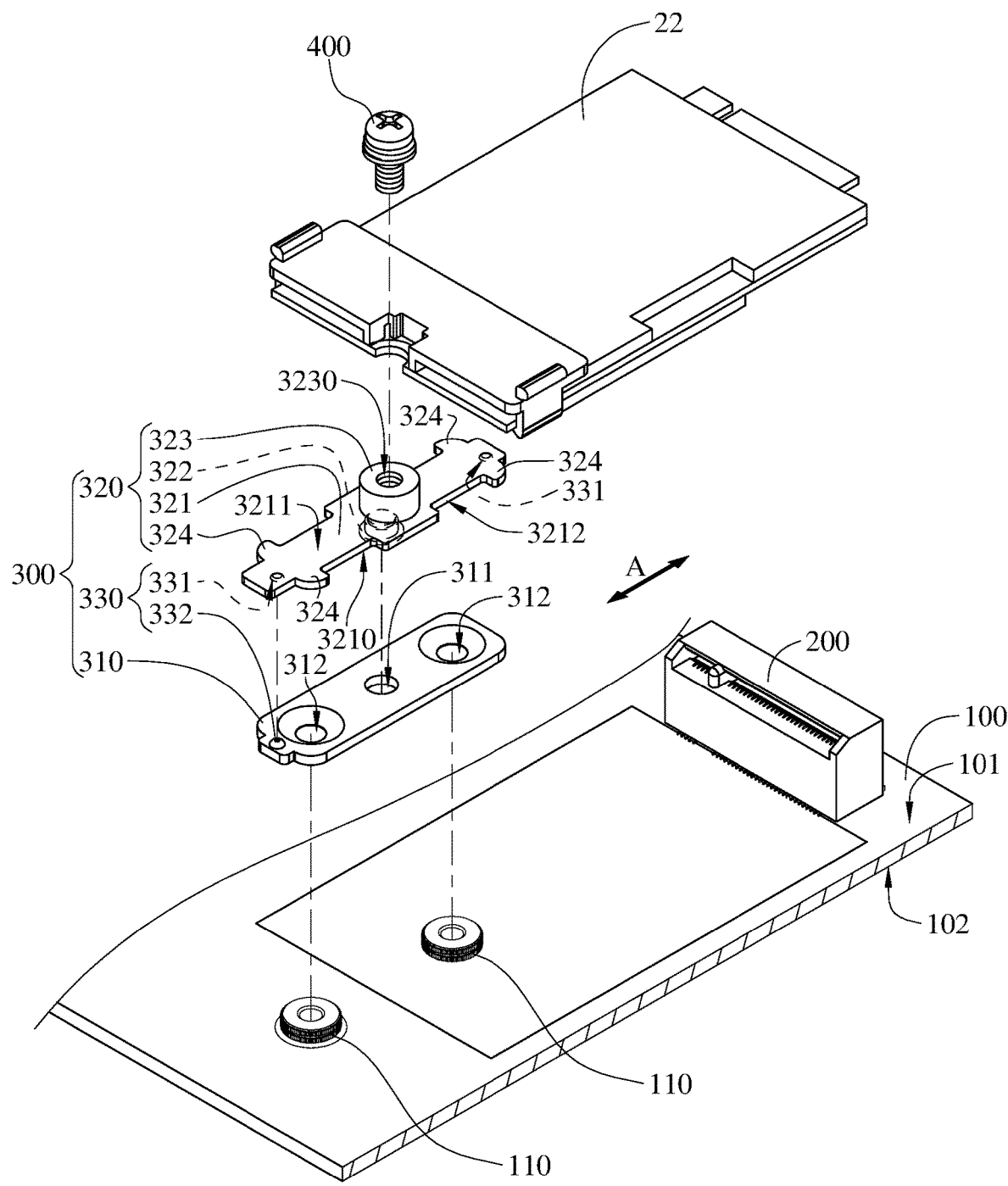
FIG. 3 is a partially enlarged exploded view of the circuit board assembly in FIG. 1.

Please refer to FIG. 3 that is a partially enlarged exploded view of the circuit board assembly 10 in FIG. 1. In this embodiment, the mounting assembly 300 includes a fixed plate 310, a rotatable plate 320 and a positioning assembly 330. The fixed plate 310 is fixed on the circuit board 100, and located on a side of the connector 200. In this embodiment, the fixed plate 310 has a pivot hole 311 and two mounting holes 312 that are spaced apart from one another. The pivot hole 311 is located between the two mounting holes 312. For example, the two mounting holes 312 are fixed on two nuts 110 on the circuit board 100 via screws (not shown), respectively.

The rotatable plate 320 includes a body part 321, a pivot part 322, a fastening part 323 and a plurality of handheld parts 324. The body part 321 has a bottom surface 3210, a top surface 3211 and a side peripheral surface 3212. The bottom surface 3210 and the top surface 3211 face away from each other. The side peripheral surface 3212 connects the bottom surface 3210 and the top surface 3211. The bottom surface 3210 faces the fixed plate 310. The pivot part 322 and the fastening part 323 protrude from the bottom surface 3210 and the top surface 3211, respectively. The handheld parts 324 protrude from the side peripheral surface 3212. The pivot part 322 is rotatably disposed in the pivot hole 311 of the fixed plate 310. The fastening part 323 has a fastening hole 3230. The fastener 400 is fixed in the fastening hole 3230. In this embodiment, the fastener 400 and the fastening hole 3230 are, for example, a screw and a screw hole, respectively. However, the disclosure is not limited thereto. In other embodiments, the fastener and the fastening hole may be a rivet and a rivet hole, respectively.

The positioning assembly 330 includes two first positioning structures 331 and a second positioning structure 332. The two first positioning structures 331 are located on the body part 321 of the rotatable plate 320, and are spaced apart from each other. The second positioning structure 332 is located on the fixed plate 310. The first positioning structure 331 and the second positioning structure 332 are a recess and a protrusion fitting with each other. For example, in this embodiment, the first positioning structure 331 is a recess, and the second positioning structure 332 is a protrusion. However, the disclosure is not limited thereto. In other embodiments, the first positioning structure may be a protrusion, and the second positioning structure may be a recess. That is, the first position structure may be a protrusion or a recess, and the second position structure may be a recess or a protrusion. Alternatively, in still other embodiments, the mounting assembly may not include the positioning assembly 330, and the rotatable plate and the fixed plate may be positioned manually.

Figure 4:
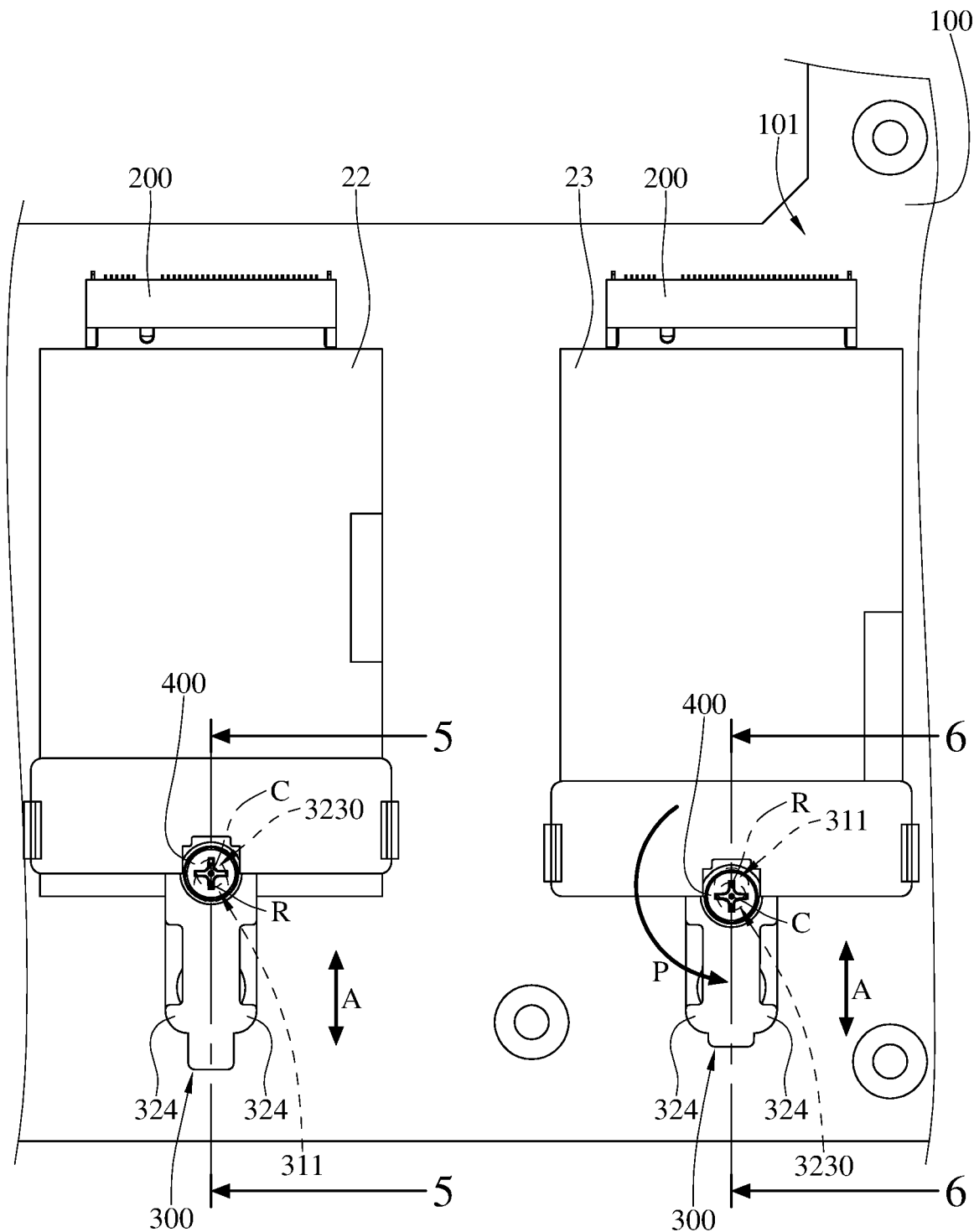
FIG. 4 is a partially enlarged view of the circuit board assembly in FIG. 2.
Figure 5:
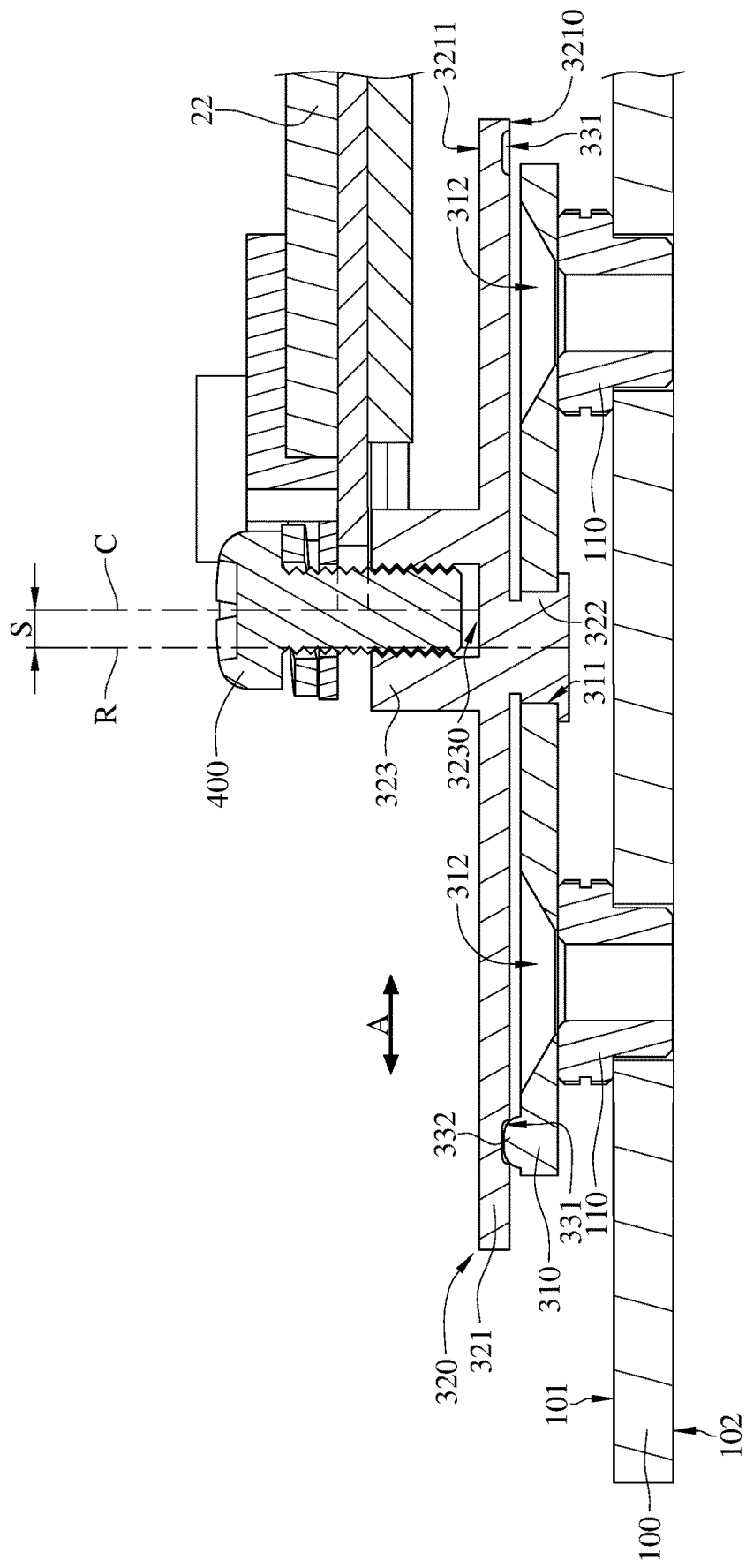
FIG. 5 is a partially enlarged cross-sectional view of the circuit board assembly taken along line 5-5 in FIG. 4.
Figure 6:
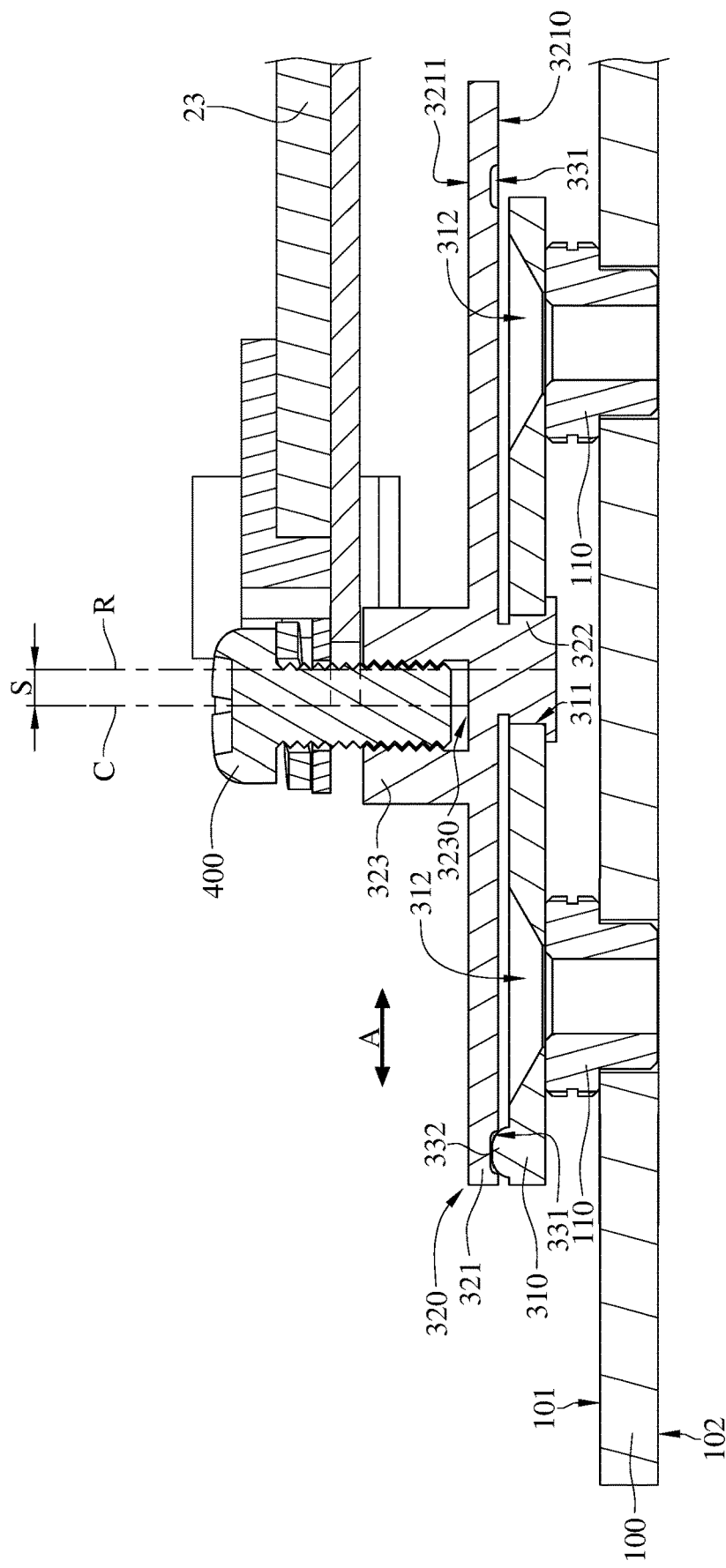
FIG. 6 is a partially enlarged cross-sectional view of the circuit board assembly taken along line 6-6 in FIG. 4.

Please refer to FIGS. 4 to 6. FIG. 4 is a partially enlarged view of the circuit board assembly 10 in FIG. 2. FIG. 5 is a partially enlarged cross-sectional view of the circuit board assembly 10 taken along line 5-5 in FIG. 4. FIG. 6 is a partially enlarged cross-sectional view of the circuit board assembly 10 taken along line 6-6 in FIG. 4. In this embodiment, for example, a pivot axis R of the pivot part 322 is spaced apart from a central axis C of the fastening hole 3230 by a distance S along a lengthwise direction A of the body part 321, such that the fastening hole 3230 has a first mounting position (as shown in FIG. 5) and a second mounting position (as shown in FIG. 6). The distance S is, for example, 1 mm (i.e., a half of the 2 mm difference between the length of the short expansion card 22 and the length of the long expansion card 23). Further, the mounting assembly 300 of this embodiment is arranged vertically, and the pivot axis R is designed to be spaced apart from the central axis C along the lengthwise direction A of the body part 321. Accordingly, the space for the wiring of the short expansion card 22 or the long expansion card 23 is prevented from being significantly occupied by the mounting assembly 300, so as to facilitate the installation of the wiring of the short expansion card 22 or the long expansion card 23.

As shown in FIGS. 4 and 5, when the rotatable plate 320 rotates relative to the fixed plate 310 and the fastening hole 3230 is at the first mounting position, the fastening hole 3230 is located closer to the connector 200 than the pivot part 322. In this way, the fastener 400 is able to fix the short expansion card 22 on the circuit board 100 from a top surface 101 of the circuit board 100 instead of a bottom surface 102. The top surface 101 is a surface where the connector 200 is disposed. In addition, one of the two first positioning structures 331 is positioned and engaged with the second positioning structure 332, so as to position the fastening hole 3230 at the first mounting position.

Hereinafter, the operation for mounting the long expansion card 23 on the circuit board 100 by the mounting assembly 300 is described. As shown in FIGS. 4 and 6, the one of the two first positioning structures 331 is firstly removed from the second positioning structure 332. Next, at least one of the handheld parts 324 is held to allow the rotatable plate 320 to be pivoted by 180 degrees along a rotation direction P. In this way, the rotatable plate 320 makes the fastening hole 3230 moved to the second mounting position. When the fastening hole 3230 is at the second mounting position, the fastening hole 3230 is located farther from the connector 200 than the pivot part 322. Thus, the fastener 400 is able to fix the long expansion card 23 on the circuit board 100 from the top surface 101 of the circuit board 100 instead of the bottom surface 102. In addition, the other of the two first positioning structures 331 is positioned and engaged with the second positioning structure 332, so as to position the fastening hole 3230 at the second mounting position.

Based on the operation described above, the mounting assembly 300 is able to be shared among the short expansion card 22 and the long expansion card 23 having similar sizes while allowing easy mounting for the short expansion card 22 or the long expansion card 23.

Further, as shown in FIG. 2, among three mounting assemblies 300 of this embodiment, the fastening hole 3230 of one mounting assembly 300 is at the first mounting position to fix the short expansion card 22, and the fastening holes 3230 of the other two mounting assemblies 300 are located at the second mounting position to fix the long expansion cards 23, respectively. Note that according to the operation described above, the position of fastening hole 3230 of each mounting assembly 300 may be adjusted according to actual requirements to fix the short expansion card 22 or the long expansion card 23, and the present disclosure is not limited by the configuration shown in the drawings.

Furthermore, in this embodiment, the short expansion card 21 is fixed to the holder 120 on the circuit board 100 via one of the fasteners 400. With respect to each connector 200, the holder 120 and the mounting assembly 300 will be interfered with each other if they both are disposed on the circuit board 100. Thus, the mounting assembly 300 should be removed from the circuit board 100 in advance and the holder 120 should be mounted on the circuit board 100 if the short expansion card 21 is required to be mounted on the circuit board 100.

Moreover, in this embodiment, as shown in FIG. 5 or FIG. 6, the body part 321 has, for example, an asymmetric shape relative to the pivot axis R of the pivot part 322 (e.g., two opposite sides of the body part 321 having different lengths relative to the pivot axis R, respectively). With such configuration, the user can recognize whether the body part 321 is at the first mounting position or the second mounting position by the asymmetric shape of the body part 321.

Other embodiments are described below for illustrative purposes. It is to be noted that the following embodiments use the reference numerals and a part of the contents of the above embodiments, the same reference numerals are used to denote the same or similar elements, and the description of the same technical contents is omitted. For the description of the omitted part, reference may be made to the above embodiments, and details are not described in the following embodiments.

Figure 7:
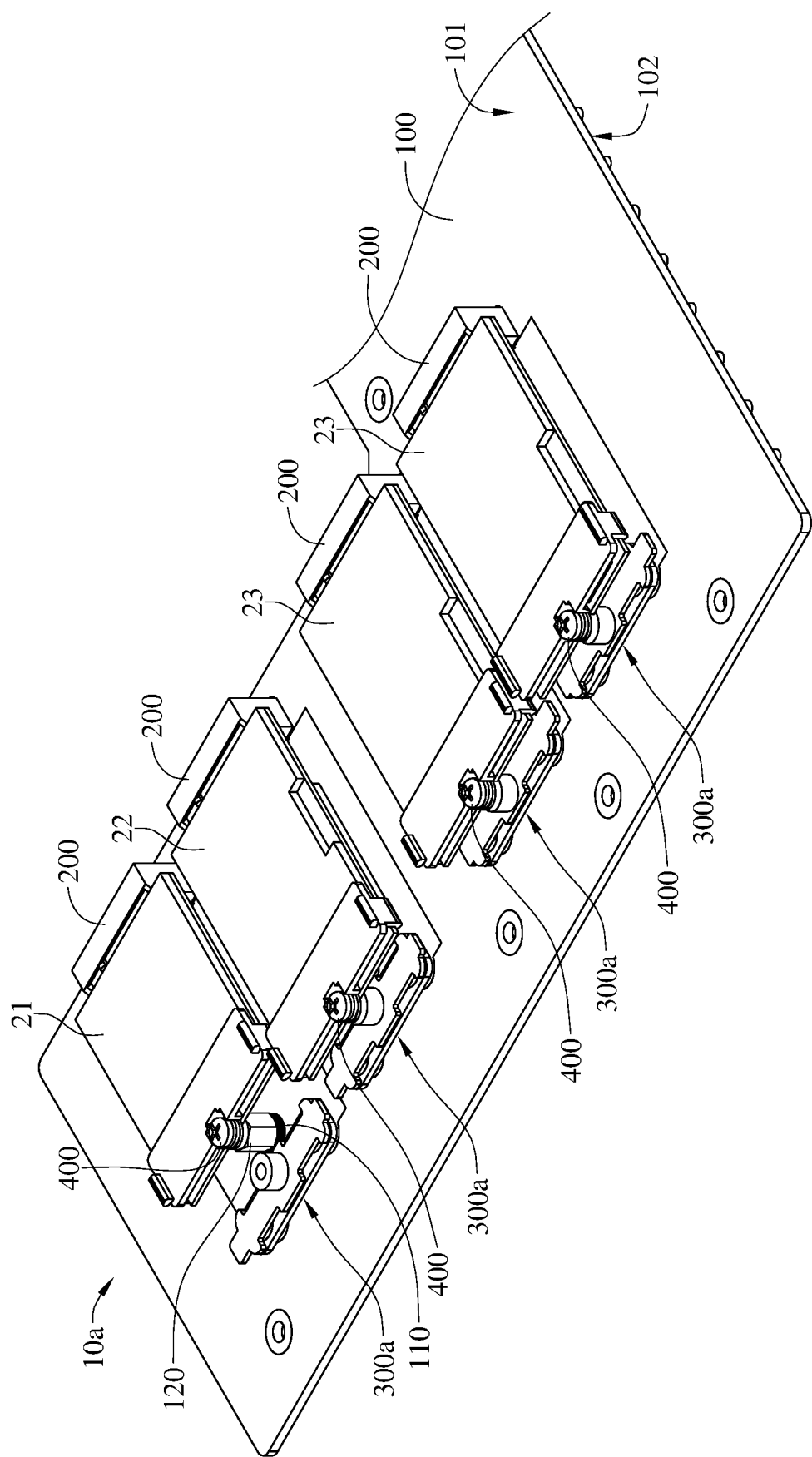
FIG. 7 is a partially enlarged perspective view of a circuit board assembly according to a second embodiment of the disclosure.
Figure 8:
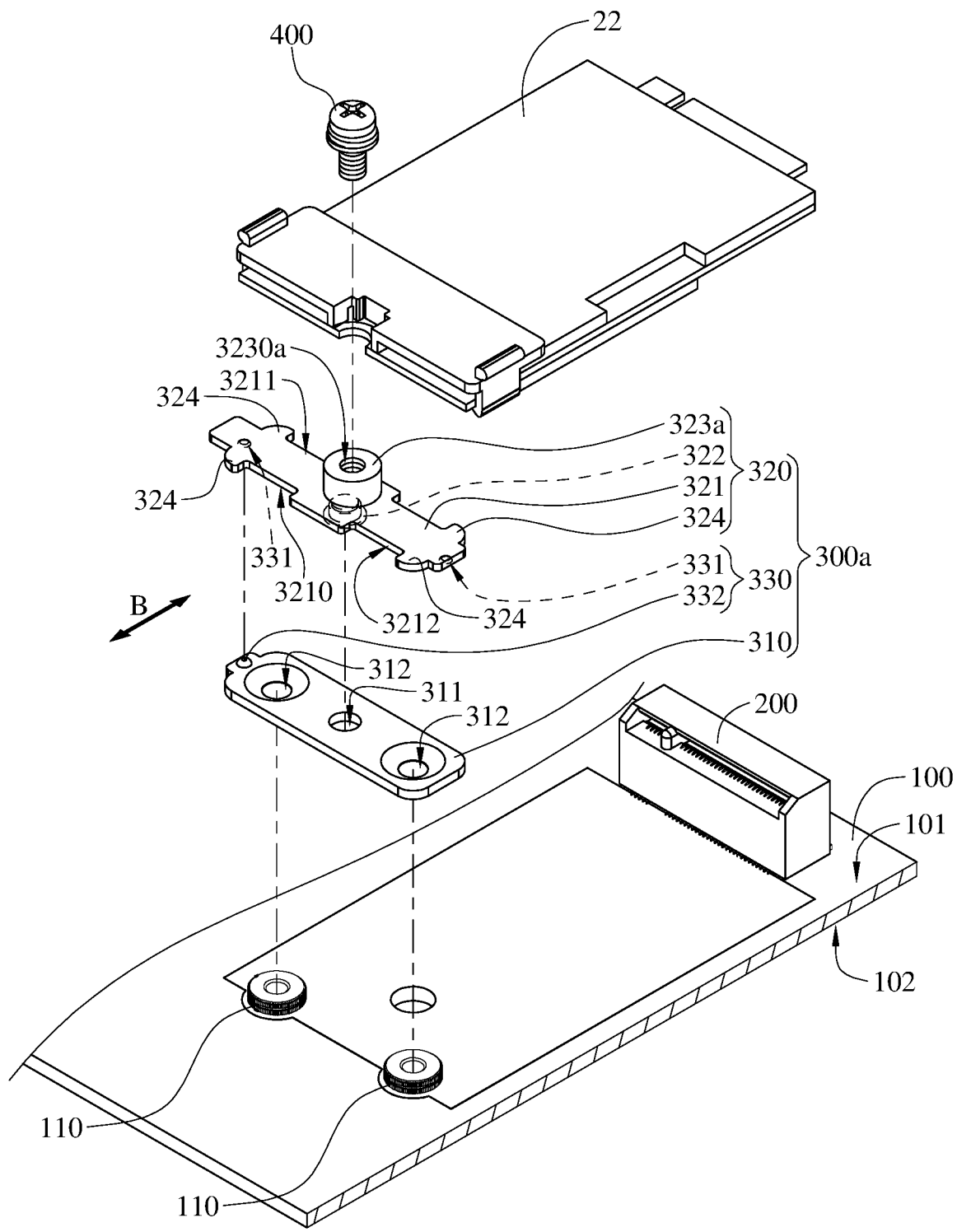
FIG. 8 is a partially enlarged exploded view of the circuit board assembly in FIG. 7.

The disclosure is not limited by the arrangement of the mounting assembly. Please refer to FIGS. 7 and 8. FIG. 7 is a partially enlarged perspective view of a circuit board assembly 10a according to a second embodiment of the disclosure. FIG. 8 is a partially enlarged exploded view of the circuit board assembly 10a in FIG. 7. The only difference between the circuit board assembly 10a of this embodiment and the circuit board assembly 10 of the first embodiment is in that the mounting assemblies 300a of this embodiment are arranged horizontally.

Figure 9:
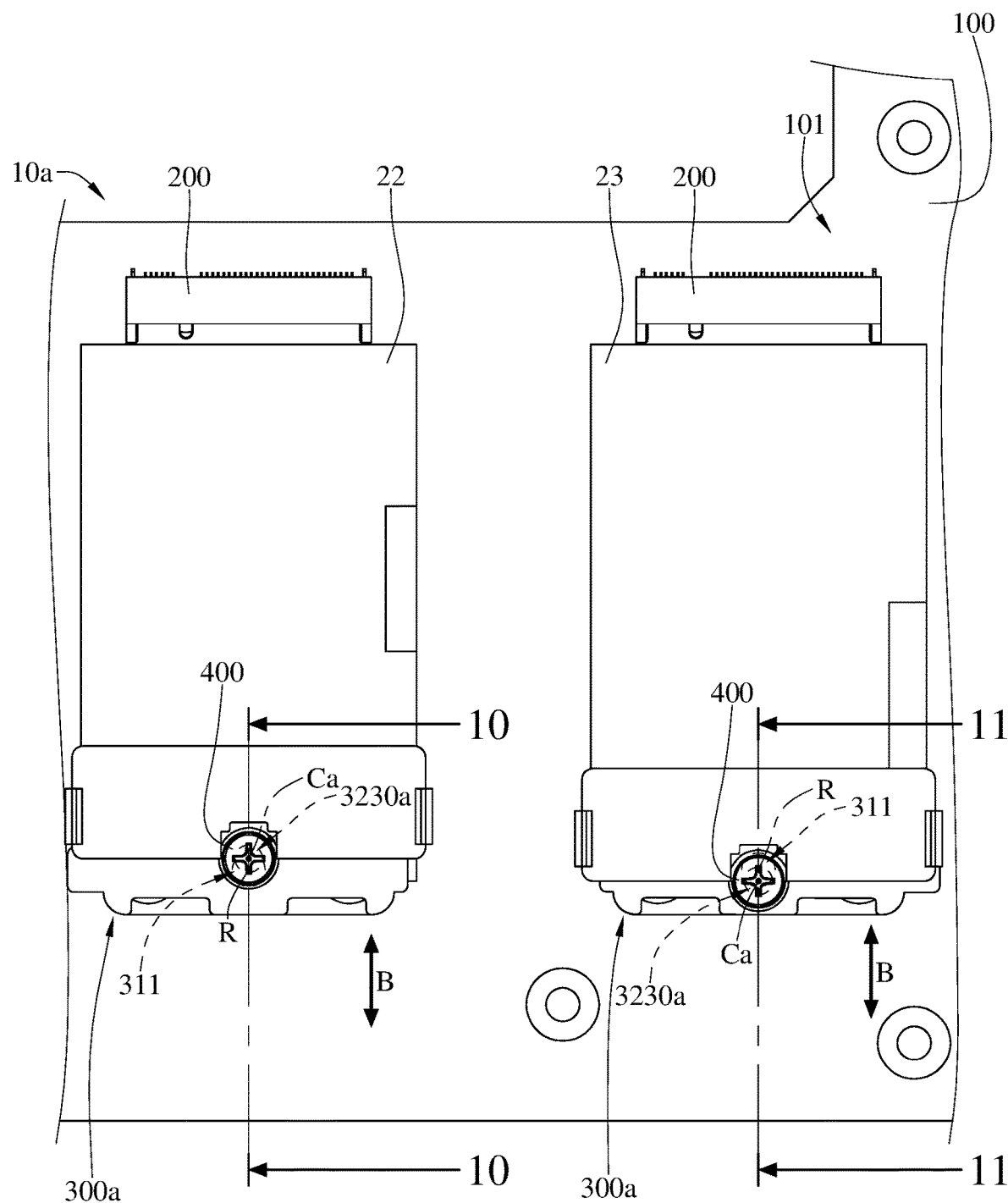
FIG. 9 is a partially enlarged top view of the circuit board assembly in FIG. 7.
Figure 10:
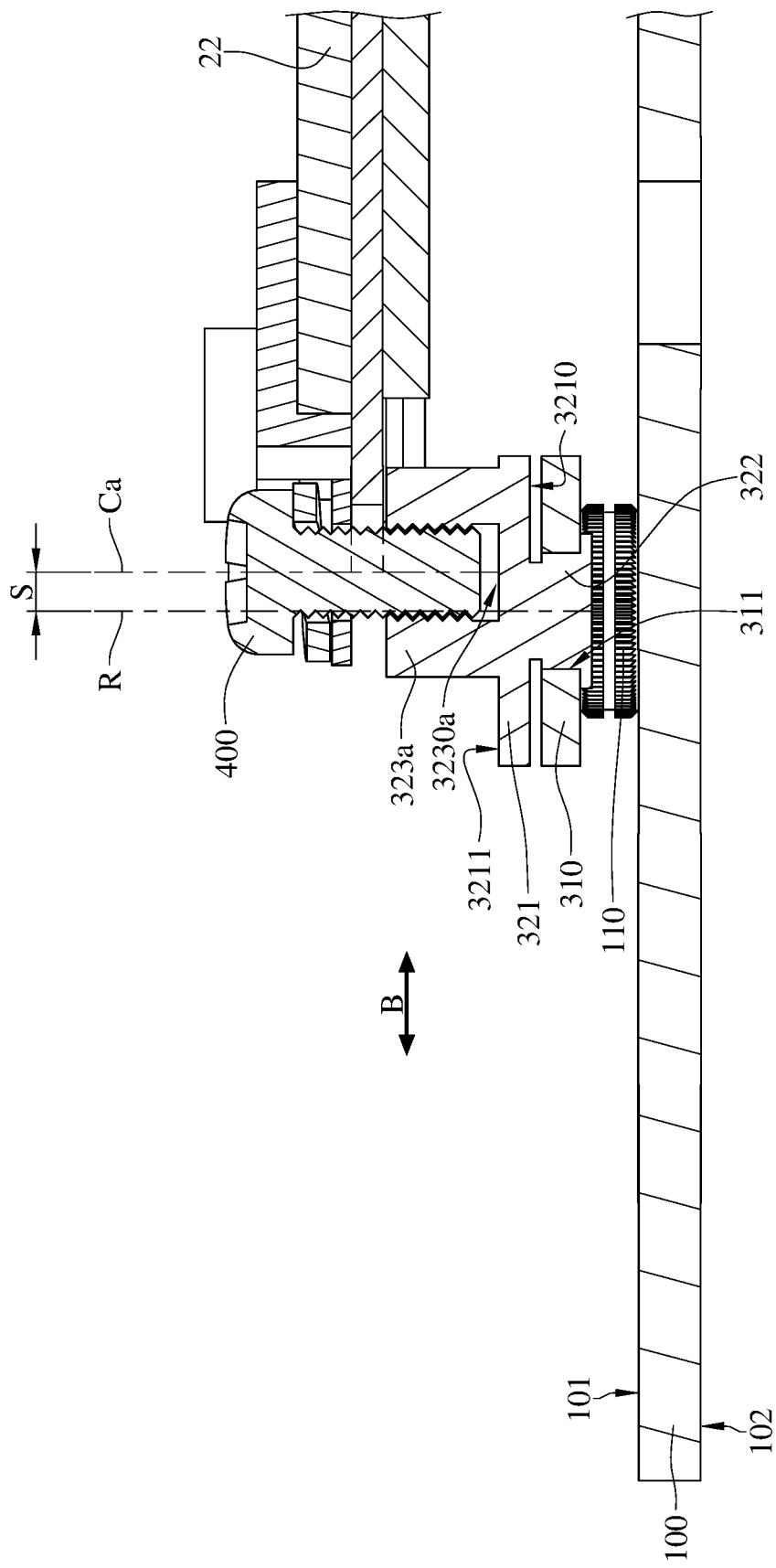
FIG. 10 is a partially enlarged cross-sectional view of the circuit board assembly taken along line 10-10 in FIG. 9.
Figure 11:
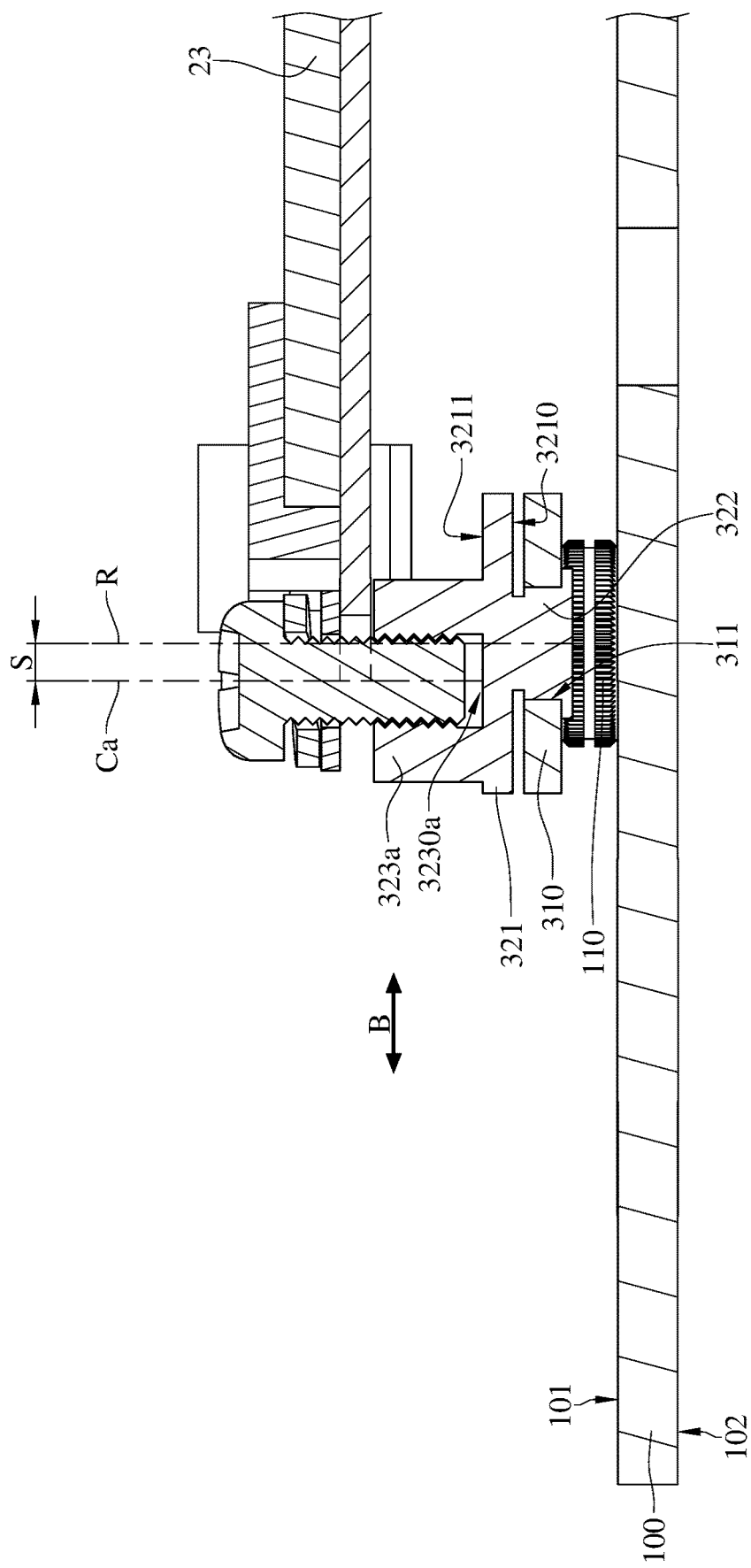
FIG. 11 is a partially enlarged cross-sectional view of the circuit board assembly taken along line 11-11 in FIG. 9.

In detail, please refer to FIGS. 9 to 11. FIG. 9 is a partially enlarged top view of the circuit board assembly 10a in FIG. 7. FIG. 10 is a partially enlarged cross-sectional view of the circuit board assembly 10a taken along line 10-10 in FIG. 9. FIG. 11 is a partially enlarged cross-sectional view of the circuit board assembly 10a taken along line 11-11 in FIG. 9. In this embodiment, the pivot axis R of the pivot part 322 is spaced apart from a central axis Ca of a fastening hole 3230a of a fastening part 323a along a widthwise direction B of the body part 321.

In this embodiment, since the mounting assemblies 300a are arranged horizontally, the holder 120 and the mounting assembly 300a are allowed to be disposed on the circuit board 100 for each connector 200 without interfering with each other. Thus, even though it is required to fix the short expansion card 21 to the holder 120, the mounting assembly 300a still can be disposed on the circuit board 100. In this way, it is more convenient to change the expansion card plugging into each connector 200.

According to the mounting assembly and the circuit board assembly disclosed by above embodiments, the pivot axis of the pivot part is spaced apart from the central axis of the fastening hole. Thus, the fastening hole is allowed to be located closer to the connector than the pivot part at the first mounting position, thereby being configured to fix the short expansion card. Also, the fastening hole is allowed to be located farther away from the connector than the pivot part at the second mounting position, thereby being configured to fix the long expansion card. Additionally, the fastener can be fixed in the fastening hole from the top surface of the circuit board. Accordingly, the mounting assembly is able to be shared among the short expansion card and the long expansion card having similar sizes while allowing easy mounting for the short expansion card or the long expansion card.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A mounting assembly, configured to mount a short expansion card or a long expansion card on a circuit board, the short expansion card or the long expansion card configured to be plugged in a connector on the circuit board, the mounting assembly comprising:

a fixed plate, configured to be fixed on the circuit board; and a rotatable plate, comprising a body part, a pivot part and a fastening part, wherein the pivot part and the fastening part protrude from two opposite sides of the body part, respectively, the pivot part is rotatably disposed on the fixed plate, the fastening part has a fastening hole, and the fastening hole is configured to allow a fastener to be fixed therein;

wherein, a pivot axis of the pivot part is spaced apart from a central axis of the fastening hole so that the fastening hole has a first mounting position and a second mounting position; when the fastening hole is at the first mounting position, the fastening hole is located closer to the connector than the pivot part to be configured to fix the short expansion card; and when the fastening hole is at the second mounting position, the fastening hole is located farther away from the connector than the pivot part to be configured to fix the long expansion card.

2. The mounting assembly according to claim 1, wherein the pivot axis of the pivot part is spaced apart from the central axis of the fastening hole along a lengthwise direction of the body part.

3. The mounting assembly according to claim 1, wherein the pivot axis of the pivot part is spaced apart from the central axis of the fastening hole along a widthwise direction of the body part.

4. The mounting assembly according to claim 1, further comprising a positioning assembly, wherein the positioning assembly comprises two first positioning structures and a second positioning structure, the two first positioning structures are located on the body part of the rotatable plate, and are spaced apart from each other, the second positioning structure is located on the fixed plate, each of the two first positioning structures and the second positioning structure are a recess and a protrusion fitting with each other; when the fastening hole is at the first mounting position, one of the two first positioning structures is positioned with the second positioning structure; and when the fastening hole is at the second mounting position, another one of the two first positioning structures is positioned with the second positioning structure.

5. The mounting assembly according to claim 1, wherein the body part has an asymmetric shape relative to the pivot axis of the pivot part.

6. The mounting assembly according to claim 1, wherein the rotatable plate further comprises a plurality of handheld parts, the body part has a bottom surface, a top surface and a side peripheral surface, the bottom surface and the top surface face away from each other, the side peripheral surface connects the bottom surface and the top surface, the bottom surface faces the fixed plate, the pivot part and the fastening part protrude from the bottom surface and the top surface, respectively, and the plurality of handheld parts protrude from the side peripheral surface.

7. The mounting assembly according to claim 1, wherein the fixed plate has a pivot hole and two mounting holes that are spaced apart from one another, the pivot hole is located between the two mounting holes, the pivot part of the rotatable plate is rotatably disposed in the pivot hole, and the two mounting holes are configured to be fixed to the circuit board.

8. A circuit board assembly, configured for a short expansion card or a long expansion card to be mounted thereon, the circuit board assembly comprising:
   a circuit board;
   a connector, disposed on the circuit board and configured for the short expansion card or the long expansion card to be plugged therein;
   a mounting assembly, comprising:
      a fixed plate, fixed on the circuit board and located on a side of the connector; and
      a rotatable plate, comprising a body part, a pivot part and a fastening part, wherein the pivot part and the fastening part protrude from two opposite sides of the body part, respectively, the pivot part is rotatably disposed on the fixed plate, and the fastening part has a fastening hole; and
   a fastener, fixed in the fastening hole;
   wherein, a pivot axis of the pivot part is spaced apart from a central axis of the fastening hole so that the fastening hole has a first mounting position and a second mounting position; when the fastening hole is at the first mounting position, the fastening hole is located closer to the connector than the pivot part to be configured to fix the short expansion card; and when the fastening hole is at the second mounting position, the fastening hole is located farther away from the connector than the pivot part to be configured to fix the long expansion card.

9. The circuit board assembly according to claim 8, wherein the pivot axis of the pivot part is spaced apart from the central axis of the fastening hole along a lengthwise direction of the body part.

10. The circuit board assembly according to claim 8, wherein the pivot axis of the pivot part is spaced apart from the central axis of the fastening hole along a widthwise direction of the body part.

* * * * *